United States Patent [19]

Widmann

[11] 4,108,717
[45] Aug. 22, 1978

[54] PROCESS FOR THE PRODUCTION OF FINE STRUCTURES CONSISTING OF A VAPOR-DEPOSITED MATERIAL ON A BASE

[75] Inventor: Dietrich Widmann, Unterhaching, Germany

[73] Assignee: Siemens Aktiengesellschaft, Berlin & Munich, Germany

[21] Appl. No.: 594,046

[22] Filed: Jul. 8, 1975

[30] Foreign Application Priority Data

Jul. 8, 1974 [DE] Fed. Rep. of Germany ....... 2432719

[51] Int. Cl.$^2$ .............................................. B05D 5/12
[52] U.S. Cl. ................................... 156/656; 96/36.2; 156/657; 156/664; 156/665; 204/192 R; 427/88; 427/89; 427/90; 427/91; 427/96; 427/124; 427/150; 427/259; 427/282
[58] Field of Search ................ 156/17, 656, 664, 665, 156/657; 427/91, 96, 124, 88, 89, 90, 282, 259, 250; 204/192 R; 357/24, 55, 68, 71; 96/36.2

[56] References Cited

U.S. PATENT DOCUMENTS

| B 316,014 | 1/1975 | Dean ........................ 156/17 |
| 3,700,510 | 10/1972 | Keene et al. ............. 156/17 |
| 3,839,111 | 10/1974 | Ham et al. ................ 156/17 |
| 3,873,361 | 3/1975 | Franco et al. ............ 427/88 |
| 3,927,418 | 12/1975 | Ando et al. .............. 357/55 |

OTHER PUBLICATIONS

Duffek et al., "Printed Circuit Board Etch Characteristics", Metal Finishing, 10-68.

G. Bergasse, "IBM Technical Disclosure Bulletin", vol. 16, No. 7, Dec. 1973.

Primary Examiner—John D. Smith
Attorney, Agent, or Firm—Hill, Gross, Simpson, Van Santen, Steadman, Chiara & Simpson

[57] ABSTRACT

A process for producing fine structures having an order of magnitude of 1 μm without a loss of dimension relative to a mask on a base such as a semiconductor device having electrode structures characterized by providing a base having a surface which is either etchable or is provided with an auxiliary etchable layer, providing a mask on the surface, which mask has openings corresponding to the fine structure of material to be applied on the surface, providing an etching agent which attacks the surfaces of the base without attacking the mask, etching the uncovered portions of the base until an under-etching of predetermined width exists beneath the edges of the mask, depositing the layer of material on the entire surface, controlling the amount of depositing so the layer of material being deposited on the mask and on the etched surfaces of the base are not in contact with each other, and subsequently removing the mask with the layer of material deposited thereon. If an auxiliary layer is on the surface it may be subsequently removed by etching without substantially etching the deposited fine structure or it may be retained to provide closely spaced electrode patterns. If the auxiliary layer is to be removed, it is of a material such as a metal alloy that can be selectively etched without damage to the material or metal deposited as the fine structure.

4 Claims, 11 Drawing Figures

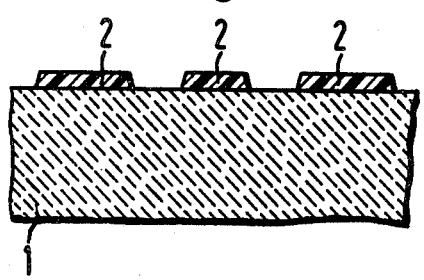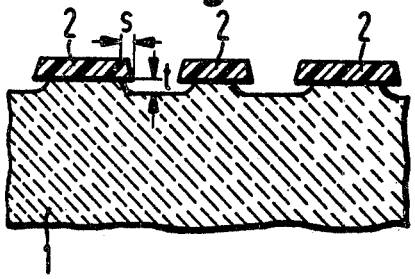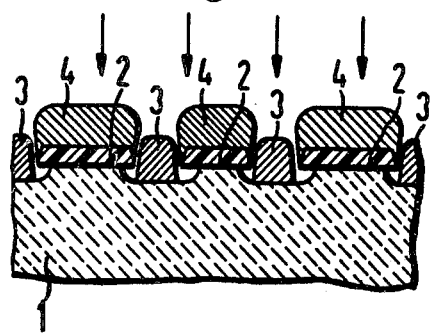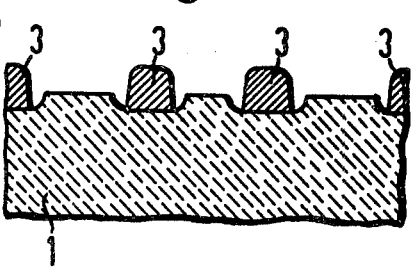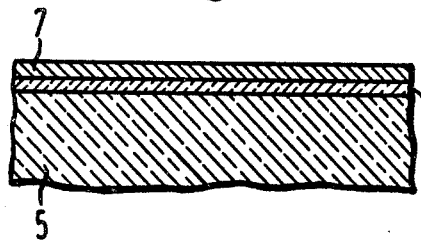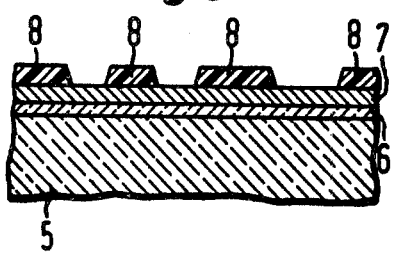

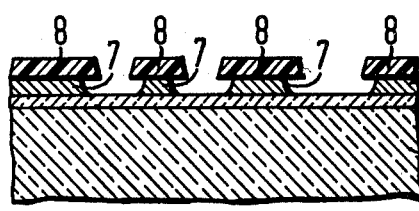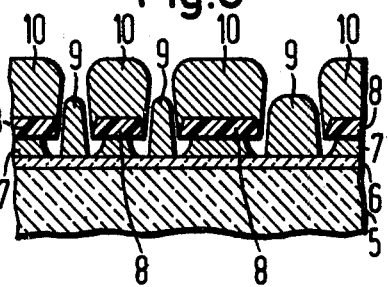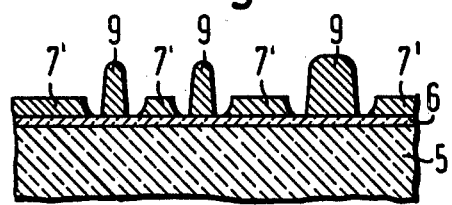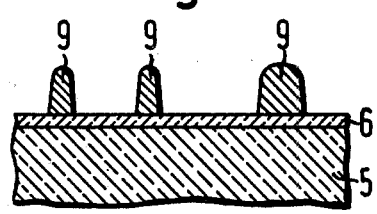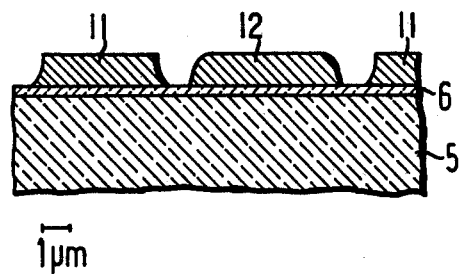

PROCESS FOR THE PRODUCTION OF FINE STRUCTURES CONSISTING OF A VAPOR-DEPOSITED MATERIAL ON A BASE

BACKGROUND OF THE INVENTION

1. Field of the Invention

The present invention relates to a process for the production of fine structures on a base such as electrode patterns or conductor patterns on a semiconducting device which method includes utilizing an etch-resistant mask and etching a portion of the base which is exposed by the mask.

2. Prior Art

Processes for forming conductor patterns by applying an etch-resistant mask on a layer of conductor material and then etching away portions of the layer of conducting material to provide conductor paths are known. Such processes are employed in the production of highly integrated semiconductor circuits with fine structures in the order of 1 $\mu$m. It is a known fact that in these circuits, the etching of the individual layers presents one of the greatest problems. These problems lead to a lateral under-etching beneath the edges of the etching mask which usually consists of a photo-resist and thus to a loss of dimensions in comparison to the etching mask structure. The under-etching is approximately equal to the thickness of the conductive layers such as aluminum layer which is to be etched. Other disadvantages of the process are based on the fact that the slopes of the etched conductor path structure at its upper part are generally vertical and that the edges of the conductor paths are generally jagged.

Ion etching processes do not have the above-mentioned disadvantages of the known processes. However, they do involve a series of other problems such as damage to the semiconductor surface or a difficulty in removing the photo-lacquer after the etching process.

SUMMARY OF THE INVENTION

The present invention is directed to a process of forming a fine structure having an order of magnitude of 1 $\mu$m without a loss of dimension relative to a mask such as a conductor pattern or electrode pattern that are particularly useful in semiconductor devices, which process does not exhibit the disadvantages of a lack of dimensional stability of the pattern formed on the base.

To accomplish these tasks, the method comprises the steps of providing a base with a surface, providing a mask on the surface of the base, said mask having edges defining openings corresponding to the fine structure of material to be applied on the surface of the base providing an etching agent which will attack the surface of the base but does not attack the mask, etching the exposed portions of the base until an under-etching of a predetermined width exists beneath the edges of the mask, depositing a layer of material over the entire surface controlling the amount of depositing so that the layer of material being deposited on the mask and the etched portions of the base are not in contact with each other and subsequently removing the mask with the layer of material deposited thereon. Preferably, the material being deposited is at least one layer of a material.

In many instances, the base is a non-etchable material or cannot be allowed to be etched. In such cases, an auxiliary layer of etchable material is applied on the base prior to providing the etch-resistant mask. This auxiliary layer may be either an etchable layer on top of a base having a plurality of layers or may be a layer which has been applied onto the base. In either case, after removal of the mask, the remaining portion of the etchable layer, if desired, may be removed by etching with an etching agent which selectively attacks or etches the remaining portions without subsequently etching the layer of fine structure and the base material. In some instances, it is desired that the remaining portion be retained to provide electrodes spaced by the gaps between the remaining portion and the fine layer structure.

The process is preferably used for the production of electrode structures and/or conductor path structures on semiconductor devices and particularly highly integrated semiconductor devices preferably of the MOS or MIS technique. The process is also utilized in producing electrode structures having a small gap such as required for charge coupled devices known as CCDs.

BRIEF DESCRIPTION OF THE DRAWINGS

FIGS. 1–4 are cross-sectional views schematically illustrating various stages of the method of the present invention;

FIGS. 5–10 are cross-sectional views schematically illustrating various stages of an embodiment of the process of the present invention; and FIG. 11 is a partial cross-sectional view of a conductor path on a semiconductor body having a spacing between the paths of approximately 1 $\mu$m.

DESCRIPTION OF THE PREFERRED EMBODIMENTS

The principles of the present invention are particularly useful in producing a device such as a microstructure having a base 1 with a plurality of conductor paths 3 disposed on a surface thereof as illustrated in FIG. 4. To produce the device of FIG. 4, a base 1 has an etch-resistant mask 2 applied on a surface thereof, see FIG. 1. The mask 2 may be in the form of a photo-resist structure which has been exposed and developed to produce a plurality of openings corresponding to the conductor paths 3 which form the fine structure to be applied on the base.

After applying the mask 2, the exposed surface is etched with at least one etching agent which attacks the material of the base 1 without attacking the material of the mask 2, to produce the stage illustrated in FIG. 2. The edges of the mask 2, which edges define the openings in the mask, are under-etched a distance S which is of a magnitude of the etching depth $t$.

Subsequent to the step of etching, the entire surface of the substrate containing the mask 2 is subjected to a material depositing step such as either by evaporation or sputtering. The material to be deposited is directed at the surface as indicated by the arrows in FIG. 3 to form deposits or layers 3 in the areas where the etching has occurred and layers or deposits 4 on the etch-resistant mask 2. The material deposited to form layers 3 and 4 may be either a pure metal or a sandwich structure consisting of several metal layers or a metal alloy.

During the step of depositing, it is important that the layers 3 and 4 do not come in contact with each other. This is achieved by controlling the depositing step such as by controlling the time of depositing, so that it is not long enough to produce layers which are thick enough to cause contact between the deposits 3 and 4. A multiple of the etching depth $t$ can be realized in case of evaporating a material such as a metal or metal alloy in a non-vertical direction to the etched surface.

After the deposition of the material, the mask 2 with the layer 4 thereon is removed by an etching agent or solvent which acts only on the material of the mask 2. After removal of the mask 2 and the layer 4, the base 1 having the deposits 3 forming the fine structure of a microstructure is obtained. The structure 3, such as conductor pattern is corresponding to the openings in the etching mask 2.

In the discussion of the method with regard to FIGS. 1-4, the base 1 was an etchable material. In many instances, the base is of a material which cannot be etched or it is undesirable to etch the material of the base. A specific embodiment of the process will be described with regard to FIGS. 5-10. In FIG. 5, a substrate 5 such as a semiconductor material is provided with an insulating layer 6, such as a grown-on silicon dioxide layer and is provided with an auxiliary layer 7. In this particular embodiment, the auxiliary layer 7 is deposited onto the layer 6 and consists of an aluminum-nickel alloy with approximately 0.5% nickel content. This deposited layer has a thickness in the range of 0.1–0.3 μm.

After providing the substrate 5 with the auxiliary layer 7, an etch-resistant mask 8 is applied on the auxiliary layer 7 (see FIG. 6). The mask 8 is preferably a photo-resist, such as AZ 1350 sold by the Shipley Company, which has been exposed and developed to provide a mask complementary to the desired conductor path structure which is to be formed on the substrate 5.

After providing the mask 8, the exposed portions of the auxiliary layer 7 are etched with an etching agent which does not attack the mask 8. An example of an etching agent is a hot concentrated phosphoric acid which is at a temperature of approximately 60° C. During the etching step, the entire exposed portions of the auxiliary layer 7 are etched away with under-etching of the edges of the mask 8 as illustrated in FIG. 7. The amount of lateral under-etching of the layer 7 beneath the edges of the mask 8 corresponds approximately to the thickness of the auxiliary layer 7 and amounts accordingly to only 0.1–0.3 μm. Subsequent to the etching step, a pure aluminum layer is evaporated onto the structure so that the aluminum layers 9 and 10 are formed. The layers 9 and 10 will have a thickness of approximately 1 μm. After depositing the pure aluminum layers 9 and 10, the photoresist and the overlying layers 10 are removed so that an intermediate stage represented in FIG. 9 is formed.

After the step of removing the mask 8 and the overlying portions 10, the remaining portion 7' of the auxiliary layer 7 and the portion 9 are present on the layer 6. Since the remaining portion 7' may cause trouble in using the device, a second etching step is applied using a hot phosphoric acid at approximately 60° C. Since such an etching agent attacks the pure aluminum at approximately one-fifth the speed that it attacks the aluminum-nickel alloy, less than 0.1 μm of the pure aluminum structure 9 is removed as the portions 7' of the auxiliary layer 7 are entirely removed. The second etching step provides the structure which is illustrated in FIG. 10 and which comprises the substrate 5 having the insulating layer 6 with the conductor paths 9 disposed thereon.

While the above described process is more expensive than the conventional processes of the prior art, the individual process steps are relatively non-critical so that high yield can be expected with minimum loss due to problems mentioned hereinbefore. For example, relatively large tolerances can be permitted for the layer thickness of the auxiliary layer 7 and for the amount of under-etching without causing any difficulties with the dimension of the conductor paths 9.

In order to achieve good transmission properties in charge-coupled devices (CCDs) the gaps between electrodes must be smaller than approximately 3 μm. An embodiment of the process of the present invention is particularly useful in producing aluminum-conductor paths or electrodes spaced by approximately 1 μm as illustrated in FIG. 11 and which are useful to produce devices such as CCDs.

In order to produce a device which has a substrate 5 having conductor patterns 11 and 12 which are spaced apart by approximately 1 μm, the above described process is slightly modified. The first step of forming or providing an auxiliary layer 7 on the substrate 5 is modified to provide a pure aluminum layer which is provided by evaporating pure aluminum with a thickness of 1 μm on the insulating layer 6. As in the previously described specific embodiment, a complementary mask 8 is applied on the auxiliary layer 7 and subjected to etching to entirely remove the aluminum layer in the exposed portions and to produce an under-etching of approximately 1 μm. After the etching step, a second pure aluminum layer is vapor-deposited over the entire area to a thickness of 1 μm to produce a structure similar to the structure illustrated in FIG. 8. After the deposition of the second aluminum layer, the mask with the overlying layer is removed to produce the product illustrated in FIG. 11.

The product of FIG. 11 has aluminum layers 11 which are the remaining portions of the etched auxiliary layer and aluminum layer 12 which was produced by depositing the second layer after the etching step. The remaining portion 11 of the auxiliary layer and the vapor-deposited layer 12 are separated from one another by gaps having a gap width of approximately 1 μm. These gap widths can be produced without the need of producing a 1 μm structure in a photo-resist mask. After the steps for producing the device of FIG. 11, the conductor paths represented by 11 and 12 have a spacing or separation at all points of approximately 1 μm. If a larger spacing is necessary at specific points, this larger spacing can be produced by following a conventional photolithographic technique.

The process of the present invention and its various embodiments described hereinabove have the following advantages in comparison with the prior art.

No loss in dimensions of the fine structure, which may be electrode or conductor patterns, will occur on account of under-etching the etch-resistant mask. Consequently, the process achieves a high creative accuracy and good reproducibility of these structures which are to be produced.

The individual process steps are not critical. For example, the individual parameters, such as the thickness of the auxiliary layer or the amount of under-etching of the mask, are not required to be accurately controlled.

When the process is used to produce highly integrated semiconductor devices, the above two advantages enable a high yield to be obtained.

The removal of the etching mask by conventional methods presents no problem because, due to the lateral under-etching of the etching mask, overhanging edges of the mask, which are required for the purpose of removing the mask, are present.

Gaps can be produced between conductor paths or electrodes which have a width in the order of less than 1 μm without the necessity of using an etch-resistant mask with a 1 μm structure. This means an increase in the packing density of integrated semiconductor circuits with a high yield. Furthermore, the process enables the production of CCDs which have gaps between the electrodes that are smaller than approximately 3 μm and which could not be achieved by conventional etching processes.

Although various minor modifications might be suggested by those versed in the art, it should be understood that I wish to employ within the scope of the patent granted hereon, all such modifications as reasonably and properly come within the scope of my contribution to the art.

I claim:

1. A process for producing a fine structure of an order of magnitude of 1 μm of a material on a surface of a base comprising the steps of:
   providing a base with an auxiliary layer forming a surface, said layer consisting of a metal or metal alloy and having a thickness which may be considerably less than the thickness of the fine structure to be formed;
   providing a mask on the surface of the base, said mask having openings corresponding to the fine structure of material to be applied on the surface of the base;
   providing an etching agent which attacks the auxiliary layer but does not attack the mask;
   etching the exposed portions of the auxiliary layer to a depth at which they are etched entirely away and an under-etching of a predetermined width exists beneath the edges of the mask;
   depositing a layer of material over the entire surface with the step of depositing the material being by evaporation or sputtering;
   controlling the amount of depositing so that the layer of material being deposited on the mask and the etched surfaces of the base has a thickness at least as large as said depth and less than a thickness which is necessary for the material deposited on the etched surface to contact the material deposited on the mask;
   subsequently removing the mask with the layer of material deposited thereon; and then
   entirely etching away the remaining portions of the auxiliary layer without substantially etching the fine structure.

2. A process according to claim 1, wherein the auxiliary layer is a layer of aluminum-nickel alloy having approximately 0.5% nickel content and a layer thickness in the range of 0.1–0.3 μm, wherein the step of depositing the layer of material forming the fine structure comprises evaporating a layer of pure aluminum, and wherein the step of providing an etching agent provides an agent comprising hot phosphoric acid at a temperature of 60° C. for both etching steps.

3. A process for producing a fine structure of an order of magnitude of 1 μm of a material on a surface of a base comprising the steps of:
   providing a base having an auxiliary layer forming a surface, said auxiliary layer consisting of a metal or metal alloy and having a thickness which may be considerably smaller than the thickness of the fine structure to be formed;
   providing a mask on the surface of the base, said mask having openings corresponding to the fine structure of material to be applied on the surface of the base;
   providing an etching agent which attacks the auxiliary layer buy does not attack the mask;
   etching the exposed portions of the auxiliary layer to a depth at which they are etched entirely away and an under-etching of a predetermined width exits beneath the edges of the mask;
   depositing a layer of material for the fine structure over the entire surface with the step of depositing the material being by evaporation or sputtering, said material of the fine structure being a metal, a metal alloy or a sandwich layer consisting of several metal alloys;
   controlling the amount of depositing so that the layer of material being deposited on the mask and the etched surfaces of the base has a thickness at least as large as said depth and less than a thickness which is necessary for the material deposited on the etched surface to contact the material deposited on the mask;
   subsequently removing the mask with the layer of material deposited thereon; and then
   entirely etching away the remaining portions of the auxiliary layer without substantially etching the fine structure.

4. A process for producing a fine structure of an order of magnitude of 1 μm of a material on a surface of a base comprising the steps of:
   providing a base with an auxiliary layer of metal forming a surface, said auxiliary layer having a thickness approximately equal to the thickness of the fine structure to be formed;
   providing a mask on the surface of the base, said mask having openings corresponding to the fine structure of material to be applied on the surface of the base;
   providing an etching agent which attacks the auxiliary layer but does not attack the mask;
   etching the exposed portions of the auxiliary layer to a depth at which they are etched entirely away and an under-etching of a predetermined width exists beneath the edges of the mask;
   depositing a layer of material over the entire surface with the step of depositing the material being by evaporation or sputtering;
   controlling the amount of depositing so that the layer of material being deposited on the mask and the etched surfaces of the base has a thickness at least as large as said depth and less than a thickness which is necessary for the material deposited on the etched surface to contact the material deposited on the mask; and
   subsequently removing the mask with the layer of material deposited thereon to leave the edges of the remaining portions of the auxiliary layer spaced from edges of the fine structure by a predetermined gap.

* * * * *